United States Patent
Perner

(10) Patent No.: US 7,248,530 B2
(45) Date of Patent: Jul. 24, 2007

(54) INTEGRATED SEMICONDUCTOR MEMORY DEVICE

(75) Inventor: Martin Perner, München (DE)

(73) Assignee: Infineon Technologies, AG, Neubiberg (DE)

( * ) Notice: Subject to any disclaimer, the term of this patent is extended or adjusted under 35 U.S.C. 154(b) by 82 days.

(21) Appl. No.: 11/261,912

(22) Filed: Oct. 31, 2005

(65) Prior Publication Data

US 2006/0109705 A1 May 25, 2006

(30) Foreign Application Priority Data

Oct. 29, 2004 (DE) ...................... 10 2004 052 589

(51) Int. Cl.
*G11C 7/00* (2006.01)
(52) U.S. Cl. ..................... 365/225.7; 365/63
(58) Field of Classification Search .................. 365/63, 365/225.7
See application file for complete search history.

(56) References Cited

U.S. PATENT DOCUMENTS

| 6,057,705 A | 5/2000 | Wojewoda et al. |
| 6,665,782 B2 | 12/2003 | Capps et al. |
| 6,738,891 B2 * | 5/2004 | Fujii et al. ..................... 712/16 |
| 6,826,111 B2 | 11/2004 | Schneider et al. |

\* cited by examiner

*Primary Examiner*—Hoai V. Ho
(74) *Attorney, Agent, or Firm*—Edell, Shapiro & Finnan, LLC

(57) ABSTRACT

An integrated semiconductor memory device includes external terminals to which an input signal can be applied to each external terminal, and a register circuit with registers. Each register stores a respective input signal. A programming circuit is also provided with programmable switching units configured such that, in a manner dependent on a respective programming state of the programmable switching units, each respective external terminal can be connected to a respective register of the register circuit. The programming circuit can be programmed by applying unit vectors of programming signals alternately to the external terminals. In this case, the programming signal having a first state is applied in each case to one of the external terminals and the programming signal having a second state is applied to the rest of the external terminals. The integrated semiconductor memory makes it possible for an unknown line scrambling to be resolved internally.

15 Claims, 5 Drawing Sheets

FIG 5A

| | | | 0 |
|---|---|---|---|
| | | | 1 |
| | | | 0 |
| | | | 0 |

| | | 0 | 1 |
|---|---|---|---|
| | | 1 | 0 |
| | | 0 | 0 |
| | | 0 | 0 |

| | 0 | 1 | 0 |
|---|---|---|---|
| | 1 | 0 | 0 |
| | 0 | 0 | 0 |
| | 0 | 0 | 1 |

|  | 1''' | 2''' | 3''' | 4''' |
|---|---|---|---|---|
|  | ↑ A1 | ↑ A2 | ↑ A3 | ↑ A4 |
| 1' → E1 ○ | 0 | 1 | 0 | 0 |
| 2' → E2 ○ | 1 | 0 | 0 | 0 |
| 3' → E3 ○ | 0 | 0 | 0 | 1 |
| 4' → E4 ○ | 0 | 0 | 1 | 0 |

↑ ↑ ↑ ↑
S1 S2 S3 S4

1 → 2' → 1'''
2 → 1' → 2'''
3 → 4' → 3'''
4 → 3' → 4'''

INTEGRATED SEMICONDUCTOR MEMORY DEVICE

CROSS REFERENCE TO RELATED APPLICATIONS

This application claims priority under 35 USC §119 to German Application No. DE 10 2004 052 589.7, filed on Oct. 29, 2004, and titled "Integrated Semiconductor Memory," the entire contents of which are hereby incorporated by reference.

FIELD OF THE INVENTION

The invention relates to an integrated semiconductor memory device whose data and address terminals are driven via feed lines.

BACKGROUND

Integrated semiconductor memories, such as DRAM (Dynamic Random Access Memory) semiconductor memories, for example, are arranged on a circuit board, for example a motherboard of a computer, and are driven by a memory controller for the purpose of storing or reading out information items. In this case, the output terminals of the memory controller are generally connected to the address and data terminals of the integrated semiconductor product according to a specified standard, for example the JEDEC (Joint Electronic Device Engineering Council) standard. However, the situation arises where it is necessary to deviate from such specified standards for layout reasons.

FIG. 1 shows a memory module including three integrated semiconductor memories 100, 200 and 300, the data terminals 1', 2', 3' and 4' of which are driven in each case by a memory controller 400. In this case, the memory controller 400 completely shields the memory products 100, 200 and 300 from the module-side driving. Consequently, for an access to memory cells of the memory products, the latter cannot be driven directly externally, but rather only via the memory controller 400 connected upstream. For this purpose, the latter is driven in a manner dependent on a read or write access at a control terminal S, at an address terminal A and in the case of a write access at a data terminal D by data. The memory controller 400 then drives the memory products connected to it via feed lines by means of a standard access protocol.

For the sake of simplicity, in FIG. 1 only data terminals of the data controller are connected to data terminals of the semiconductor products via the feed lines. The driving of control and address terminals of memory products by the memory controller is not illustrated. For driving the three memory products, the memory controller 400 has a total of twelve data terminals arranged in three identical groups. Each of the three groups of data terminals includes the data terminals 1, 2, 3 and 4. According to the standard specified in the example of FIG. 1, the data terminals of the memory controller 400 are intended to be linearly connected in each case to the data terminals of the individual integrated semiconductor memories. This means that the data terminals 1 of the memory controller 400 are intended to be connected to a respective one of the data terminals 1' of the semiconductor products. Correspondingly, a respective one of the data terminals 2 of the memory controller is intended to be connected to a respective one of the data terminals 2' of the semiconductor memories, a respective one of the data terminals 3 of the memory controller is intended to be connected to a respective one of the data terminals 3' of the memory products and a respective one of the data terminals 4 of the memory controller is intended to be connected to a respective one of the data terminals 4' of the semiconductor memories. For reasons of an efficient layout, however, the data terminals of the semiconductor memory 300 are driven in interchanged fashion by the memory controller 400 in the example of FIG. 1. By way of example, one of the data terminals 1 of the memory controller 400, instead of being connected to the data terminal 1' of the memory product 300, is connected to the data terminal 2' thereof. Correspondingly, one of the data terminals 2 of the memory controller 400, instead of being connected to the data terminal 2' of the memory product 300, is connected to the data terminal 1' of the semiconductor memory 300. Likewise, in comparison with the wiring of the memory products 100 and 200 with the memory controller 400, the data terminals 3' and 4' of the memory product 300 are also driven in interchanged fashion by the memory controller 400.

FIG. 2 shows an enlarged illustration of one of the three groups of data terminals 1, 2, 3 and 4 of the memory controller 400, which are connected to the data terminals 1', 2', 3' and 4' of the memory product 300 via lines L on a circuit board. The actual memory chip 30 is situated within the housing of the memory product 300. The contacts of the memory chip 30 to the outside world, the so-called pads PD, are connected via bonding wires B to the data terminals, the so-called pins of the memory product 300. Each pad of the memory chip 30 is connected to a register 1", 2", 3" and 4" of a register circuit R on the memory chip. If data signals are transmitted from the memory controller to the memory cell array via the pads, then said signals are buffer-stored in the register circuit R and from there stored in the memory cells SZ of a memory cell array SZF arranged on the semiconductor memory. The memory cells SZ of the memory cell array are generally arranged along word lines WL and bit lines BL. In the case of DRAM memory cells, a memory cell comprises a storage capacitor SC, which can be connected to a connected bit line BL via a selection transistor AT.

The meaning of the individual pins 1', 2', 3' and 4' is given by the product pad definition. In the case of standard-conforming wiring, the information present at the pin 1' is stored via the pad connected to the bonding wire in the register 1" of the memory product. Likewise, the information items present at the pins 2', 3' and 4' are stored within the product via the corresponding pads in the registers 2", 3" and 4".

In addition to a standard-deviating interchange of data lines between the memory controller and a connected memory product, however, interchanges may also occur among the address lines between the memory controller and the memory products.

If the memory product has been tested as free of defects, however, and the interchange or deviation from a standard with regard to the wiring of data and/or address lines, so-called scrambling, between the memory controller and the memory product is known, the scrambling of the data and/or address terminals does not significantly influence the functioning of the products. In this case, on one memory chip, by way of example, a programmable logic circuit is arranged between the pads and further circuit components of the memory chip which are driven by signals applied to the pads.

U.S. Pat. No. 6,665,782 describes a circuit group including a transmitting unit, for example a camera, and a receiving unit, for example a memory unit for storing digital photographs from the camera. In order to prevent unauthorized users from exchanging data between the transmitting and receiving units, terminals of the camera chip within the transmitting unit are connected via a programmable logic circuit to external output terminals of the transmitting unit. External input terminals of the receiving unit are thus driven with interchanged signals by the transmitting unit. In order to reverse the scrambling within the receiving unit, a further programmable logic circuit is situated between the external input terminals of the receiving unit and terminals of the memory chip of the receiving unit. If the scrambling scheme used in the transmitting unit is known, the programmable logic circuit of the receiving unit can be programmed complementarily with respect to the programmable logic circuit of the transmitting unit in order to resolve the scrambling.

On the other hand, scrambling of data and/or address lines on a memory module becomes problematic and time-consuming, however, when testing the individual memory products on the module. After soldering on the memory products and wiring with the memory controller, the products generally have to be tested anew, since it is not possible to rule out degradation of memory cells within the memory products by the stress in the course of being soldered onto the module circuit board. In order to discover specific defect mechanisms, characteristic data or voltage topologies are written to the memory cell arrays.

If the data topologies are generated within a tester, the actual test program is adapted to the respective module circuit board depending on scrambling of the data and/or address terminals on the module. Depending on the module type, it is thus possible to predefine an adapted line scrambling which is drawn up and maintained for the test run. Furthermore, modern test systems have a logical data scrambler which, in address-dependent fashion, chooses the polarity of the information to be written.

Since the test programs have to be repeatedly rewritten depending on the scrambling used on the circuit board, the method is very time-consuming. If each memory product on a module is wired differently with the memory controller, a dedicated test program has to be used for each memory product and the same test has to be repeated multiply on a module depending on the number of memory products present. The associated outlay for ensuring a high test severity results in increased test costs. If, on the other hand, the individual adaptation of the test programs depending on the line scrambling used on a module test circuit board is dispensed with, individual memory products cannot be tested at all. The consequence is a deficient or not adapted and deterministic test severity.

In addition to the generation of data topologies within a tester, memory modules often also have special circuits, so-called module self-test engines, which can generate corresponding data topologies for testing. On account of the simple and space-saving construction of these circuits, however, the test engines are usually unable to resolve the scrambling. In this case, products whose data and/or address line wiring between the corresponding terminals of the memory controller and of the semiconductor product deviates from the predefined standard cannot be tested at all or can only be tested inadequately.

The document DE 101 31 277 A1 describes a semiconductor memory device having an address decoder device. In an address-decoded operating mode, an applied physical address specifying a physical position of a memory cell in a memory cell array is decoded into an electrical address of the memory cell to be addressed. If physical and electrical address diverge in the case of the semiconductor memory device, then an external test system can directly input the physical address of the memory cell to be addressed into an address input device of the semiconductor memory device. The "address scrambling" is thus effected directly by the address decoder device on the semiconductor memory device. In addition to the address decoder device, a data decoder device may also be provided on the semiconductor memory device. In a similar manner to the "address scrambling", in a data-decoded operating mode, said data decoder device performs a "data scrambling" if "normal" memory cells, in which a logic "0" is stored for example by means of a negatively charged state and "inverted" memory cells, in which a logic "0" is stored for example by means of a positively charged state, are present.

SUMMARY OF THE INVENTION

An object of the present invention is to provide an integrated semiconductor memory device in which signals which drive terminals of the integrated semiconductor memory in a manner that deviates from a definition are fed to a circuit component of the integrated semiconductor memory in a manner corresponding to the definition.

Another object of the present invention is to provide a method in which signals which drive terminals of an integrated semiconductor memory in a manner that deviates from a definition are fed to a circuit component of the integrated semiconductor memory in a manner corresponding to the definition.

The aforesaid objects are achieved individually and/or in combination, and it is not intended that the present invention be construed as requiring two or more of the objects to be combined unless expressly required by the claims attached hereto.

In accordance with the invention, an integrated semiconductor memory comprises external terminals to which an input signal can be applied in each case, a register circuit with registers, where each register is provided to store a respective one of the input signals. The integrated semiconductor memory furthermore comprises a programming circuit with programmable switching units, via which, in a manner dependent on a respective programming state of the programmable switching units, a respective one of the external terminals can be connected to a respective one of the registers of the register circuit. The programming circuit is configured such that the programming state of one of the programmable switching units of the programming circuit is programmed by a respective programming signal being applied to the external terminals the programming signal applied to one of the external terminals having a first state and the programming signals respectively applied to the other of the external terminals having a second state.

An integrated semiconductor memory designed in this way makes it possible to feed input signals according to a definition, for example a JEDEC standard, to registers of the integrated semiconductor memory independently of the order in which the input signals are fed to the external terminals of the integrated semiconductor memory. The programming circuit ensures that input signals which are applied to the external terminals of the integrated semiconductor memory by a tester, for example, are fed to the registers of the register circuit in accordance with the definition as defined, even if the external terminals are driven by the input signals in a manner counter to the definition, that is to say counter to a predefined standard. Consequently, a test system need not be reprogrammed in wiring-specific fashion for storing a data topology. On the output side, the tester generates at its data and/or address terminals data and/or address vectors which merely need to be adapted to the defect mechanism to be tested. Consequently, a reprogramming of the data and/or address vectors depending on the wiring of the semiconductor memory is not necessary.

The programming circuit, which is connected between the external terminals of the integrated semiconductor memory and the registers of the register circuit, can be programmed in a simple manner for resolving the line scrambling. For this purpose, the programming signal having a first level is applied to a respective one of the external terminals and the programming signal having a second level is applied to the other programming terminals. Consequently, the interchange scheme with which the external terminals are driven by a transmitting unit, for example a tester or else a memory controller, does not need to be known for the memory-internal resolution of the line scrambling.

In accordance with one embodiment of the integrated semiconductor memory device of the invention, the programming circuit includes a plurality of input terminals and a plurality of output terminals. A respective one of the external terminals can be connected to a respective one of the input terminals of the programming circuit. Furthermore, a respective one of the output terminals of the programming circuit can be connected to a respective one of the registers of the register circuit. A respective one of the input terminals of the programming circuit can be connected to a respective one of the output terminals of the programming circuit.

In another embodiment of the integrated semiconductor memory device of the invention, first controllable switches and second controllable switches are provided. A respective one of the external terminals can be connected to a respective one of the input terminals of the programming circuit via a respective one of the first controllable switches. A respective one of the output terminals of the programming circuit can be connected to a respective one of the registers of the register circuit via a respective one of the controllable switches.

The programmable switching units in each case can include a controllable switch, via which one of the input terminals of the programming circuit can be connected to one of the output terminals of the programming circuit.

In accordance with one embodiment of the integrated semiconductor memory device of the invention, the programmable switching units are connected to a terminal for application of a control voltage. The programmable switching units in each case have a further controllable switch. The control voltage can be fed via the respective further controllable switch of the programmable switching units to a respective control terminal of the controllable switch of the programmable switching units.

In another embodiment of the integrated semiconductor memory device of the invention, the programmable switching units in each case contain a programmable element. The respective programmable element of the programmable switching units is connected, on the output side, to a respective control terminal of the further controllable switch of the programmable switching units.

In accordance with a further embodiment of the integrated semiconductor memory device of the invention, the respective programmable element of the programmable switching unit is further configured such that, in the programmed state, it controls the respective further controllable switch of the programmable switching units into the on state, so that the control voltage is fed to the respective control terminal of the controllable switch of the programmable switching units and controls the respective controllable switch of the programmable switching units into the on state. The respective programmable element of the programmable switching units is further configured such that, in the non-programmed state, it turns off the respective further controllable switch of the programmable switching units, so that the control voltage is isolated from the respective control terminal of the controllable switch of the programmable switching units and the respective controllable switch of the programmable switching units is thus turned off.

The programmable elements can be formed in each case as fuse elements. The programmable elements are preferably formed in each case as a bistable multivibrator.

In accordance with one embodiment of the integrated semiconductor memory device of the invention, the bistable multivibrators are arranged in rows and columns. The bistable multivibrators of a row are connected up as shift registers.

In one preferred embodiment, the integrated semiconductor memory device includes third controllable switches. A respective one of the shift registers can be connected, on the input side, to a respective one of the registers of the register circuit via a respective one of the third controllable switches.

The integrated semiconductor memory preferably includes fourth controllable switches. A respective one of the external terminals can be connected to a respective one of the registers of the register circuit via a respective one of the fourth controllable switches.

For programming the programming circuit, the third and fourth controllable switches are controlled into the on state. The programming circuit is subsequently programmed by unit vectors of programming signals being applied alternately to the external terminals. In this case, the programming signal having a first state is applied in each case to one of the external terminals and the programming signal having a second state is applied to the rest of the external terminals. The method is repeated until the first programming state has been applied once to each of the external terminals. The programming circuit is then programmed and makes it possible for an unknown line scrambling to be resolved internally. For this purpose, the third and fourth controllable switches are turned off again and instead the first and second controllable switches are controlled into the on state, so that the external terminals are connected to the registers of the register circuit via the programmable switching units of the programming circuit. In this case, a programmed switching unit connects an external terminal to one of the registers of the register circuit. Signals that are applied to the external terminals are buffer-stored in the register circuit before they are forwarded from there to further circuit components of the integrated semiconductor memory.

The external terminals can be in each case formed as address terminals or as data terminals.

A method for operating an integrated semiconductor memory device in accordance with the invention comprises providing an integrated semiconductor memory device including external terminals to which an input signal can be applied in each case, a register circuit with registers, a respective one of the registers being provided for storing a respective one of the input signals, a programming circuit with programmable switching units, via which, in a manner dependent on a respective programming state of the programmable switching units, a respective one of the external terminals can be connected to a respective one of the registers of the register circuit. The programming circuit is configured such that the programming state of one of the programmable switching units of the programming circuit is programmed by a respective programming signal being applied to the external terminals, the programming signal applied to one of the external terminals having a first state and the programming signals respectively applied to the other of the external terminals having a second state. The method involves programming a number of programmable switching units, which corresponds to the number of external terminals, by carrying out a programming step. In this programming step, the programming signal having a first state is applied to one of the external terminals and the programming signal having a second state is applied to the rest of the external terminals. The programming step specified is repeated, in which, upon each repetition of the programming step, the programming signal having the first state is applied to another of the external terminals and the programming signal having the second state is applied to the rest of the external terminals until the programming signal having the first state has been applied precisely once to each of the external terminals.

The programming of the programmable switching units is effected in the context of an initialization of the programming circuit. So-called unit data/address vectors are transmitted from the controller side on the feed lines to the data and/or address terminals of the integrated semiconductor memory. A logic "0" is communicated on all the feed lines apart from one. A logic "1" is transmitted, by contrast, on one of the feed lines. The unit vectors are collected in an address register or in a data register in the semi-conductor memory. From the address or data register, the unit vectors are forwarded to the programmable switching units for the stepwise programming thereof. If one of the programmable switching units is driven with a logic "1", then it is in the programmed state. As a result, each of the external terminals of the programming circuit can be connected to each of the registers of the register circuit in a manner that reverses the interchanged driving of the external terminals.

In one embodiment, the integrated semiconductor memory device is operable in a first or second operating state. A respective one of the external terminals is connected to one of the registers of the register circuit in the first operating state of the integrated semiconductor memory with bridging of the programming circuit. In the second operating state of the integrated semiconductor memory, a respective one of the external terminals is connected via a respective one of the programmable switching units of the programming circuit to a respective one of the registers of the register circuit.

The above and still further objects, features and advantages of the present invention will become apparent upon consideration of the following detailed description of specific embodiments thereof, particularly when taken in conjunction with the accompanying drawings where like numerals designate like components.

BRIEF DESCRIPTION OF THE DRAWINGS

FIGS. 5A-5D show a programming of a programming circuit according to the invention.

DETAILED DESCRIPTION

Figure 1:
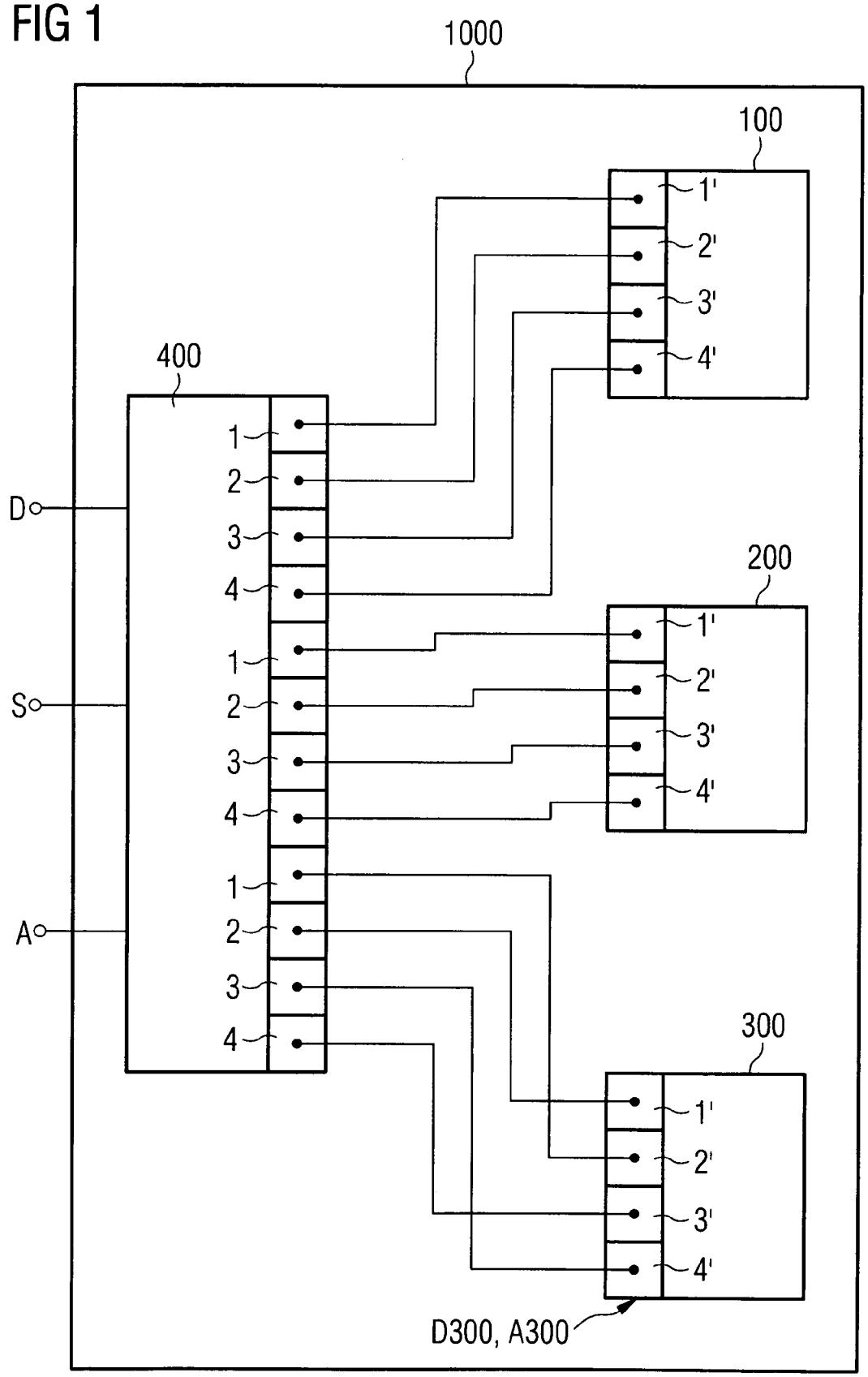
FIG. 1 shows a memory module with different wiring of feed lines to data terminals between a memory controller and semiconductor memory products.
Figure 2:
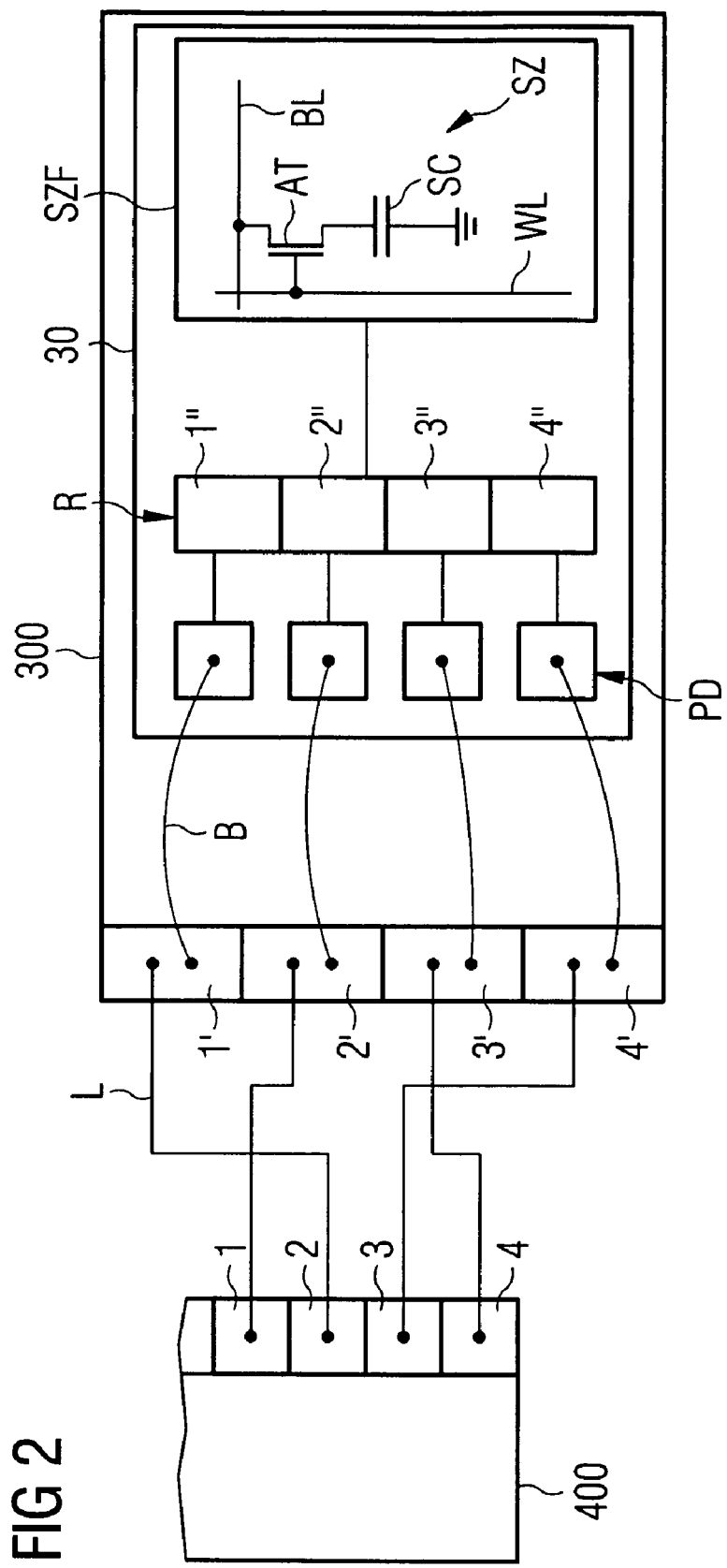
FIG. 2 shows an enlarged illustration of a memory product whose data lines are driven by a memory controller with a wiring that deviates from a standard.
Figure 3:
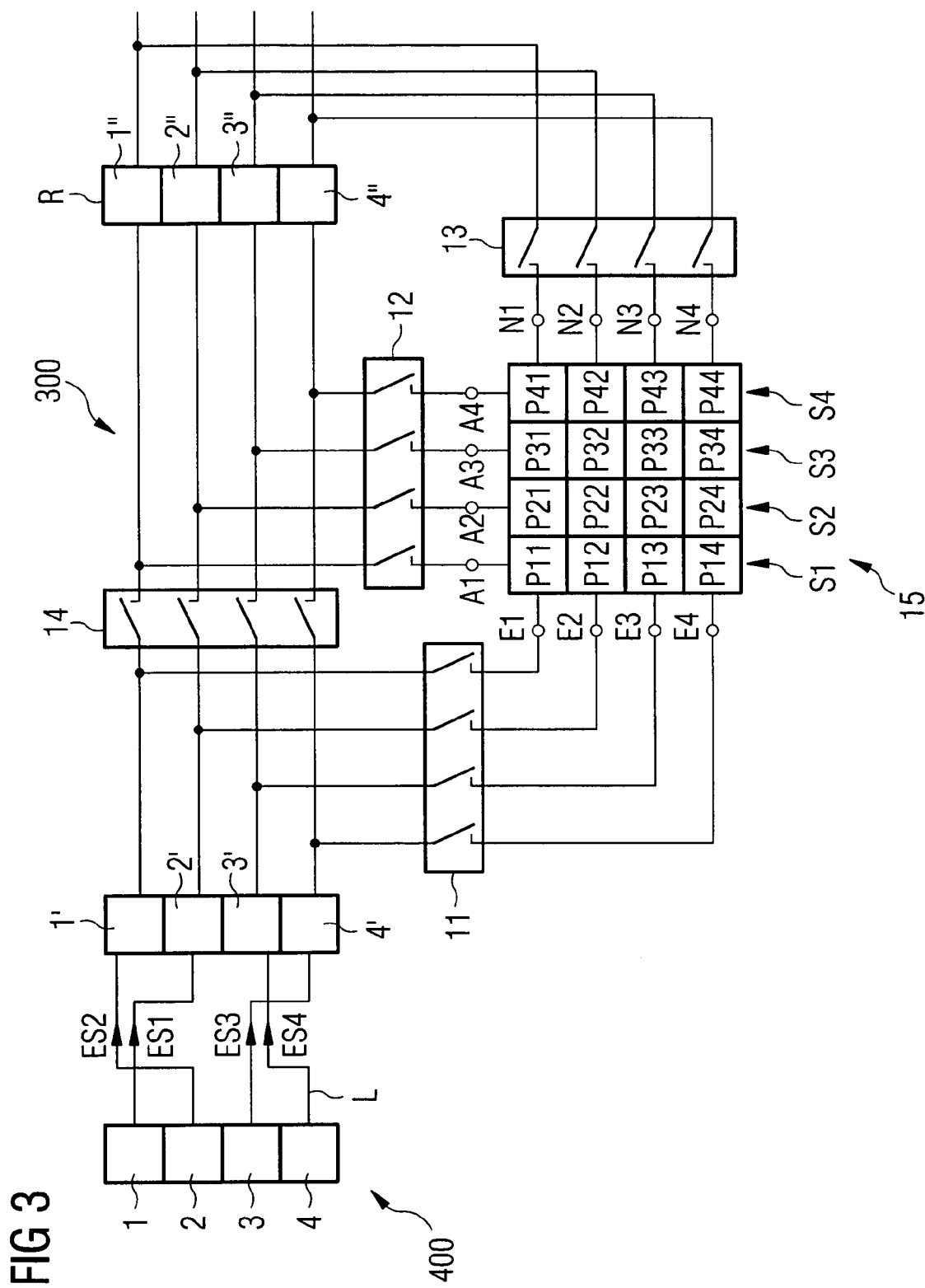
FIG. 3 shows a circuit arrangement for carrying out a "rescrambling" according to the invention.

FIG. 3 shows the data terminals 1, 2, 3 and 4 of the memory controller 400, which are connected via data lines L to the data terminals 1', 2', 3' and 4' of the memory module 300. The data pins 1', 2', 3' and 4' are connected via controllable switches 14 to the registers 1", 2", 3" and 4" of the register circuit R. On the output side, the register circuit R is connected to the memory cell array SZF of FIG. 2, where the memory cell array is not illustrated in FIG. 3. As a result of the scrambling of the lines L, the input signal ES1 generated at the controller terminal 1 for the memory product is fed to the data pin 2' and, via one of the controllable switches 14, to the register 2" of the register circuit R. The input signal ES2 generated at the data output 2 of the memory controller 400 is fed to the data pin 1' and, via one of the controllable switches 14, to the register 1" of the register circuit R. The input signal ES3 generated at the controller output is fed to the data pin 4' and, via one of the controllable switches 14, to the register 4" of the register circuit R. The input signal ES4 generated at the data output 4 of the memory controller 400 is fed to the data pin 3' and thus to the register 3" of the register circuit R.

In order to store data in accordance with a data topology in the memory cells of the memory cell array, it is required by way of a standard that the input signal ES1 be fed to the data terminal 1' and, respectively, to the register 1", the input signal ES2 be fed to the data terminal 2' and, respectively, to the register 2", the input signal ES3 be fed to the data terminal 3' and, respectively, to the register 3", and the input signal ES4 be fed to the data terminal 4' and, respectively, to the register 4". As explained above, the feeding of the input signals ES1, . . . , ES4 deviates, however, from the required feeding to the data terminals 1', . . . , 4' and, respectively, to the registers 1", . . . , 4".

The register circuit R is connected to a programming circuit 15 via a controllable switch 13. The programming circuit 15 includes programmable switching units P11, . . . , P44 arranged in matrix-type fashion within the programming circuit 15. The input signal that is buffer-stored in the register 1" can be fed via one of the controllable switches 13 to a programming terminal N1 and thus to the programmable switching units P11, P21, P31 and P41. The input signal that is buffer-stored in the register 2" can be fed via one of the controllable switches 13 to a programming terminal N2 and thus to the programmable switching units P12, P22, P32 and P42. The input signal that is buffer-stored in the register 3" can be fed via one of the controllable switches 13 to a programming terminal N3 and thus to the programmable switching units P13, P23, P33 and P43. The input signal that is buffer-stored in the register 4" can be fed via one of the controllable switches 13 to a programming terminal N4 and thus to the programmable switching units P14, P24, P34 and P44.

The programming circuit 15 has, in addition to the programming terminals N1, N2, N3 and N4, input terminals E1, E2, E3 and E4, which can be connected to the data pins 1', 2', 3' and 4' via controllable switches 11. If the controllable switches 14 are turned off and in contrast the controllable switches 11 are controlled into the on state, then the input signals present at the data pins 1', 2', 3' and 4' are fed via the programmable switching units to output terminals A1, A2, A3 and A4 of the programming circuit 15. The output terminals A1, A2, A3 and A4 are connected via controllable switches 12 to the registers 1", 2", 3" and 4" of the register circuit R. The input signals can thus be written directly to the registers of the register circuit R via the controllable switches 14 or, with switches 14 controlled into the off state and switches 11 and 12 controlled into the on state, be fed to the registers of the register circuit R via the programmable switching units.

The programmable switching unit P11, in the programmed state, connects the input terminal E1, the programmable switching unit P12, in the programmed state, connects the input terminal E2, the programmable switching unit P13, in the programmed state, connects the input terminal E3 and the programmable switching unit P14, in the programmed state, connects the input terminal E4 to the output terminal A1 of the programming circuit. The programmable switching unit P21, in the programmed state, connects the input terminal E1, the programmable switching unit P22, in the programmed state, connects the input terminal E2, the programmable switching unit P23, in the programmed state, connects the input terminal E3 and the programmable switching unit P24, in the programmed state, connects the input terminal E4 to the output terminal A2 of the programming circuit. The programmable switching unit P31, in the programmed state, connects the input terminal E1, the programmable switching unit P32, in the programmed state, connects the input terminal E2, the programmable switching unit P33, in the programmed state, connects the input terminal E3 and the programmable switching unit P34, in the programmed state, connects the input terminal E4 to the output terminal A3 of the programming circuit 15. The programmable switching unit P41, in the programmed state, connects the input terminal E1, the programmable switching unit P42, in the programmed state, connects the input terminal E2, the programmable switching unit P43, in the programmed state, connects the input terminal E3 and the programmable switching unit P44, in the programmed state, connects the input terminal E4 to the output terminal A4 of the programming circuit 15.

The programmable switching units P11, P21, P31 and P41 can in each case be programmed by a programming signal at the programming terminal N1. The programmable switching units P12, P22, P32 and P42 can in each case be programmed by a programming signal at the programming terminal N2. The programmable switching units P13, P23, P33 and P43 can in each case be programmed by a programming signal at the programming terminal N3. The programmable switching units P14, P24, P34 and P44 can in each case be programmed by a programming signal at the programming terminal N4.

Figure 4B:
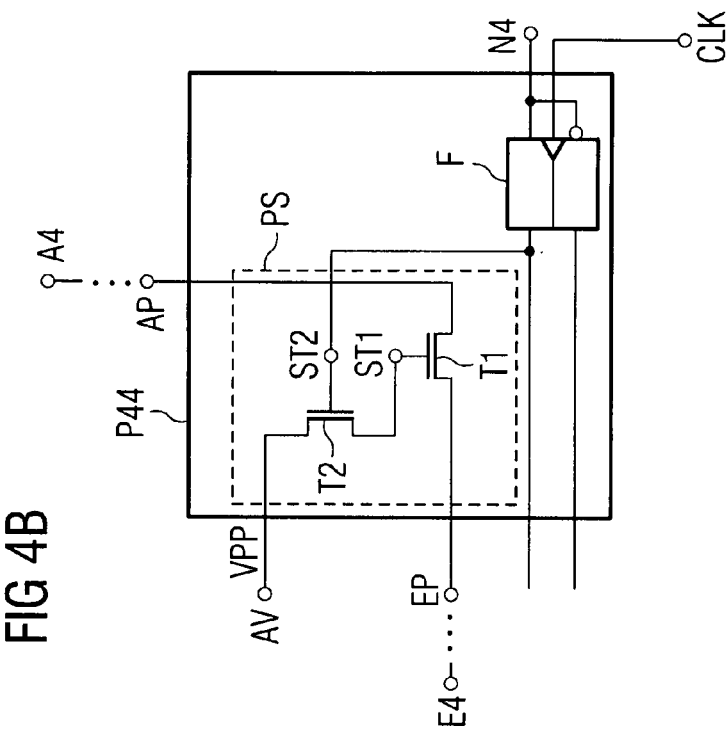
FIG. 4B shows an embodiment of a programmable switching unit according to the invention.
Figure 4A:
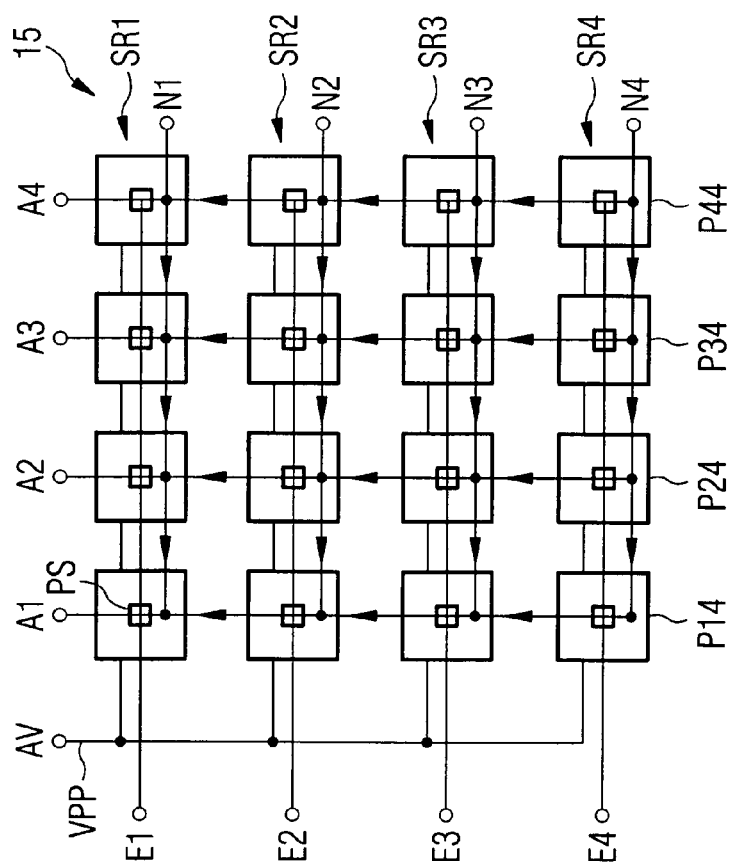
FIG. 4A shows an embodiment of a programmable programming circuit according to the invention.

FIG. 4A shows the matrix-type arrangement of the programmable switching units P11, . . . , P44 of the programming circuit 15. The programmable switching units each have programmable switches PS. In a programmed state of the programmable switch PS, the programmable switch in each case connects one of the input terminals E1, . . . , E4 of the programming circuit to one of the output terminals A1, . . . , A4 of the programming circuit. Furthermore, each of the programmable switching units is connected to a terminal AV for application of a voltage potential VPP. The voltage potential VPP is for example a voltage which is also used for driving the word lines of the memory cell array in order to control the selection transistors of the memory cells into the on state.

FIG. 4B illustrates the programmable switching unit P44 with the programmable switch PS in enlarged fashion. The programmable switching unit P44 furthermore includes a programmable element F, which is designed as a multivibrator in the exemplary embodiment. The set inputs of the multivibrator are connected to the programming terminal N4. On the output side, the multivibrator F is connected to a further multivibrator within the programmable switching unit P34. The multivibrators of the programmable switching units P44, P34, P24 and P14 thus form a shift register SR4.

When the multivibrators of the shift register SR4 are driven with a clock signal CLK, the state stored in one of the multivibrators of the shift register SR4 is shifted in the shift register SR4 by one position into the next multivibrator of the shift register SR4. In the same way as the multivibrators that are programmable via the programming terminal N4, the multivibrators that are programmable via the programming terminal N3 also form a shift register SR3, the multivibrators that are programmable via the programming terminal N2 also form a shift register SR2, and the multivibrators that are programmable via the programming terminal N1 also form a shift register SR1.

The programmable switching unit P44 has an input terminal EP, which is connected to the input terminal E4, and an output terminal AP, which is connected to the output terminal A4 of the programming circuit 15. The input terminal EP is connected to the output terminal AP of the programmable switching unit via a switching transistor T1. A control terminal ST1 of the switching transistor T1 is connected via a switching transistor T2 to the terminal AV for application of the control voltage VPP. A control terminal ST2 of the switching transistor T2 is controlled by the multivibrator F on the output side.

If the programming terminal N4 is driven with a high level of a programming signal, the multivibrator F is set with a state "1". Upon the next clock signal CLK, the state "1" is advanced into the programmable switching unit P34. For this purpose, the multivibrator F generates on the output side a high signal level that controls the switching transistor T2 into the on state, so that the control terminal ST1 of the switching transistor T1 is driven by the control voltage VPP. The control voltage VPP has a high potential level that also controls the switching transistor T1 into the on state. Consequently, the input terminal E4 of the programming circuit 15 is connected to the output terminal A4.

The functioning of the programming circuit 15 will be explained in more detail below with reference to FIGS. 5A, 5B, 5C and 5D. The method can be applied in parallel to the memory products arranged on the memory module. For the sake of simplicity, the method is described below on the basis of the integrated semiconductor memory 300.

In order to initialize the programmable switching units of the programming circuit 15, the memory product 300 is driven by the memory controller 400 with a control signal, for example the mode register set command, which is applied to the address terminals of the semiconductor product in order to set a bit in a mode register of the memory product. A control circuit of the memory product 300 thereupon switches the controllable switches 13 and 14 into the on state, whereas the controllable switches 11 and 12 remain turned off.

In accordance with FIG. 5A, the memory controller 400 first generates the input signals ES=(ES1, ES2, ES3, ES4) =(1, 0, 0, 0) at its data terminals 1, 2, 3 and 4. On account of the line scrambling, the data pins 1', 2', 3' and 4' of the memory product 300 are thus driven by the input signal levels 0, 1, 0, 0. These values are stored in the registers 1", 2", 3" and 4" likewise in the order 0, 1, 0, 0. Via the controllable switches 13 controlled into the on state, the multivibrators within the programmable switching units of the column S4 are programmed with the programming states (P41, P42, P43, P44)=(0, 1, 0, 0). Consequently, only the multivibrator of the programmable switching unit P42 thus has a programmed state.

The subsequent step for initializing the programming circuit 15 is illustrated in FIG. 5B. The memory controller generates an input signal having the level ES=(ES1, ES2, ES3, ES4)=(0, 1, 0, 0) at its data terminals. On account of the line scrambling, the data pins 1', 2', 3' and 4' of the memory product 300 are thus driven by the signal levels 1, 0, 0, 0. Accordingly, the registers 1", 2", 3" and 4" of the register circuit R are programmed with the states 1, 0, 0, 0.

Upon the subsequent clock signal, the states stored in the programmable switching units P41, P42, P43 and P44 are advanced into the column S3. The programmable switching units of the column S3 thus assume the programming states (P31, P32, P33, P34)=(0, 1, 0, 0). Via the controllable switches 13, the programming states (P41, P42, P43, P44) =(1, 0, 0, 0) are programmed into the column S4 of the programming circuit 15. Consequently, only the programmable element P41 is in a programmed state.

In the next initialization step, the memory controller then generates the input signal sequence ES=(ES1, ES2, ES3, ES4)=(0, 0, 1, 0) at its data terminals. The data pins 1', 2', 3' and 4' of the semiconductor products 300 are thus driven by the signal levels 0, 0, 0, 1 on account of the line scrambling illustrated in FIG. 3. These states are in turn buffer-stored in the same order in the registers of the register circuit by means of the linear connection between the data pins and the registers of the register circuit.

During the subsequent clock cycle, the states stored in the column S3 are advanced into the column S2 and the states stored in the column S4 up to that point are transferred into the column S3. The programmable switching units of the column S4 of the programming circuit 15 are finally programmed, via the controllable switches 13, with the programming states (P41, P42, P43, P44)=(0, 0, 0, 1) which are buffer-stored in the registers of the register circuit. Consequently, the programmable element P44 is in a programmed state after the third clock cycle.

The memory controller 400 subsequently generates the input signal levels (ES1, ES2, ES3, ES4)=(0, 0, 0, 1) as input signal sequence at its data terminals 1, 2, 3 and 4. On account of the line scrambling, the data pins 1', 2', 3', 4' of the memory product 300 are thus driven by the signals 0, 0, 1, 0 which are buffer-stored in the registers 1", 2", 3" and 4" of the register circuit.

In the subsequent fourth clock cycle, the programming states stored in the programmable switching units of the columns S2, S3 and S4 are in turn shifted by one column in each case, so that the programmable switching units of the column S1 are ultimately programmed with the programming states (P11, P12, P13, P14)=(0, 1, 0, 0), the programmable switching units of the column S2 are programmed with the programming states (P21, P22, P23, P24)=(1, 0, 0, 0) and the programmable switching units of the column S3 are programmed with the programming states (P31, P32, P33, P34)=(0, 0, 0, 1). Via the registers 1", 2", 3" and 4" and the controllable switches 13, the programmable switching units of the column S4 of the programming circuit 15 are then programmed with the programming states (P41, P42, P43, P44)=(0, 0, 1, 0). Consequently, the programming states illustrated in FIG. 5D are stored in the programmable switching units or in the multivibrators F of the programmable switching units P11, . . . , P44.

In the programming circuit 15, therefore, only the programmable switching units P12, P21, P34 and P43 are in a programmed state. In the programmed state, the switching transistors T1 and T2 of the programmable switching units are switched into the on state. Consequently, the input terminal E2 is connected to the output terminal A1 via the programmed switching unit P12. The input terminal E1 is connected to the output terminal A2 via the programmed switching unit P21. The input terminal E4 is connected to the output terminal A3 via the programmed switching unit P34, and the input terminal E3 is connected to the output terminal A4 via the programmed switching unit P43.

In a subsequent test operating state of the integrated semiconductor memory, the controllable switches 13 and 14 are turned off and the controllable switches 11 and 12 are controlled into the on state. Consequently, a signal present at the data pin 1' is fed to the register 2", a signal present at the data pin 2' is fed to the register 1", a signal present at the data pin 3' is fed to the register 4", and a signal present at the data pin 4' is fed to the register 3". As a result, the signals generated by the memory controller at its data terminals 1, 2, 3 and 4 are stored in the registers 1", 2", 3" and 4" of the register circuit R.

This linear connection of data terminals of the memory controller to the registers of the register circuit is independent of the line scrambling used. Consequently, in a functional test of the memory module, despite different line scrambling, all the memory products 100, 200 and 300 are driven by the memory controller 400 with the same signal sequence on the input side. The programming circuit 15 ensures that, independently of the line scrambling used, the signal generated at the data terminal 1 of the memory controller 400 is always stored in the register 1" of the register circuit, the signal generated at the data terminal 2 of the memory controller 400 is stored in the register 2" of the register circuit, the signal generated at the data terminal 3 of the memory controller 400 is stored in the register 3" of the register circuit, and the signal generated at the data terminal 4 of the memory controller is stored in the register 4" of the register circuit of the memory products 100, 200 and 300.

This means that, for the purpose of individually writing to the memory products a data signal sequence that is identical for all the memory products, the same data topology can be generated at the data terminals 1, 2, 3 and 4 of the memory controller in the respective memory cell array of the memory products. A register within the memory controller 400 which allocates data signals to the respective data terminals of each group of data terminals thus only needs to be programmed once and is therefore independent of the respective line scrambling of a memory product connected to the memory controller 400.

Even though the functioning of the programming circuit 15 for discovering the line scrambling of data lines has been explained with reference to the figures illustrated, it can also be used for discovering the line scrambling of address lines. In both cases, the programming circuit 15 is to be connected between the data/address pins and the downstream register of the memory product.

The programming circuit 15 is preferably arranged on the semiconductor memory. However, it may also be used within the memory controller or within a tester. In this case, the unit vector signals ES=(1, 0, 0, 0); (0, 1, 0, 0); (0, 0, 1, 0); (0, 0, 0, 1) are generated by the memory products 100, 200 and 300. Programming circuits corresponding to the number of memory products driven are contained on the memory controller or in the tester. As a result, a product-specific rescrambling matrix is stored within the memory controller or the tester.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

| List of reference symbols | |
|---|---|
| 1, 2, 3, 4 | Data terminals of the memory controller |
| 1', 2', 3', 4' | Data terminals of the memory product |
| 1", 2", 3", 4" | Registers of the register circuit |
| 100, 200, 300 | Memory product |
| 1000 | Memory module |
| 11, 12, 13, 14 | Controllable switches |
| 15 | Programming circuit |
| 30 | Memory chip |
| 400 | Memory controller |
| A | Address terminal |
| AT | Selection transistor |
| AV | Terminal for control voltage |
| B | Bonding wire |
| BL | Bit line |
| CLK | Clock signal |
| D | Data terminal |
| ES | Input signal |
| F | Multivibrator |
| L | Conductor track |
| N | Programming terminal |
| P | Programmable switching unit |
| PD | Pad |
| S | Control terminal |
| SC | Storage capacitor |
| SR | Shift register |
| ST | Control terminal |
| SZ | Memory cell |
| SZF | Memory cell array |
| T | Switching transistor |
| VPP | Control voltage |
| WL | Word line |

What is claimed:

1. An integrated semiconductor memory device comprising:
   a plurality of external terminals, each external terminal being configured to receive a respective input signal;
   a register circuit including a plurality of registers, each register being configured to store a respective input signal; and
   a programming circuit including a plurality of programmable switching units that are operable to selected programming states in order to facilitate a connection between each external terminal and a respective register of the register circuit;
   wherein the programming circuit is configured such that the programming state of each programmable switching unit of the programming circuit is programmed by a respective programming signal being applied by a respective external terminal such that the programming signal applied to one of the external terminals has a first state and the programming signal applied to each of the other external terminals has a second state.

2. The integrated semiconductor memory device of claim 1, wherein:
   the programming circuit includes a plurality of input terminals and a plurality of output terminals;
   each external terminal is connectable to a respective input terminal of the programming circuit;
   each output terminal of the programming circuit is connectable to a respective register of the register circuit; and
   each input terminal of the programming circuit is connectable to a respective output terminal of the programming circuit.

3. The integrated semiconductor memory device of claim 2, further comprising:
   a plurality of first controllable switches and a plurality of second controllable switches;
   wherein:
      each external terminal is connectable to a respective input terminal of the programming circuit via a respective first controllable switch; and
      each output terminal of the programming circuit is connectable to a respective register of the register circuit via a respective controllable switch.

4. The integrated semiconductor memory device of claim 1, wherein each of the programmable switching units includes a respective controllable switch that selectively connects an input terminal of the programming circuit to a respective output terminal of the programming circuit.

5. The integrated semiconductor memory device of claim 4, wherein:
   the programmable switching units are connected to a terminal that applies a control voltage;
   each programmable switching unit includes a further controllable switch; and
   the control voltage is fed via the respective further controllable switch of each programmable switching unit to a control terminal of the respective controllable switch of the programmable switching unit.

6. The integrated semiconductor memory device of claim 5, wherein each programmable switching unit contains a programmable element that is connected, on an output side, to a control terminal of the further controllable switch of the programmable switching unit.

7. The integrated semiconductor memory device of claim 6, wherein:
   each programmable element is configured such that, in a programmed state, the programmable element controls the further controllable switch of the respective programmable switching unit into an on state, so that the control voltage is fed to the control terminal of the controllable switch of the respective programmable switching unit and controls the controllable switch of the respective programmable switching unit into an on state; and
   each respective programmable element is further configured such that, in a non-programmed state, the programmable element controls further controllable switch of the respective programmable switching unit into an off state, so that the control voltage is isolated from the control terminal of the controllable switch of the respective programmable switching unit and the controllable switch of the respective programmable switching unit is turned to an off state.

8. The integrated semiconductor memory device of claim 1, wherein each programmable element is formed as a fuse element.

9. The integrated semiconductor memory device of claim 3, wherein each programmable element is formed as a bistable multivibrator.

10. The integrated semiconductor memory device of claim 9, wherein the bistable multivibrators are arranged in rows and columns, and each row of bistable multivibrators are connected with each other to form a shift register.

11. The integrated semiconductor memory device of claim 9, further comprising:
   a plurality of third controllable switches, wherein each shift register is connectable, on an input side, to a respective register of the register circuit via a respective third controllable switch.

12. The integrated semiconductor memory device of claim 11, further comprising:
   a plurality of fourth controllable switches, wherein each external terminal is connectable to a respective register of the register circuit via a respective fourth controllable switch.

13. The integrated semiconductor memory of claim 1, wherein each external terminal is formed as an address terminal or as a data terminal.

14. A method for operating an integrated semiconductor memory device, comprising:
   providing an integrated semiconductor memory device including a plurality of external terminals to which an input signal can be applied to each external terminal, a register circuit including a plurality of registers, each register configured to store a respective input signal, a programming circuit including a plurality of programmable switching units that are configured, in a manner dependent on a respective programming state of the programmable switching units, to facilitate a connection between each external terminal and a respective register of the register circuit, the programming circuit being configured such that the programming state of one of the programmable switching units of the programming circuit is programmed by a respective programming signal being applied to the external terminals, the programming signal applied to one of the external terminals having a first state and the programming signals applied to all other external terminals having a second state;
   programming a selected number of programmable switching units that corresponds to the number of external terminals by carrying out a programming step in which the programming signal having a first state is applied to one of the external terminals of the selected number and the programming signal having a second state is applied to the rest of the external terminals of the selected number;
   repeating the step of programming the selected number of programmable switching units such that, upon each repetition of the programming step, the programming signal having the first state is applied to a different external terminal and the programming signal having the second state is applied to the rest of the external terminals until the programming signal having the first state has been applied a single time to each external terminal.

15. The method of claim 14, wherein the integrated semiconductor memory device is operable in a first operating state and a second operating state, and the method further comprises:
   connecting each external terminal to a respective register of the register circuit in the first operating state of the integrated semiconductor memory device via bridging of the programming circuit; and
   connecting each external terminal via a respective programmable switching unit of the programming circuit to a respective register of the register circuit in the second operating state of the integrated semiconductor memory device.

* * * * *